(12) United States Patent
Baluswamy

(10) Patent No.: US 7,862,964 B2
(45) Date of Patent: *Jan. 4, 2011

(54) METHODS FOR PHOTO-PROCESSING PHOTO-IMAGEABLE MATERIAL

(75) Inventor: Pary Baluswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/820,929

(22) Filed: Jun. 22, 2010

(65) Prior Publication Data

US 2010/0261107 A1  Oct. 14, 2010

Related U.S. Application Data

(63) Continuation of application No. 11/166,558, filed on Jun. 24, 2005, now Pat. No. 7,767,363.

(51) Int. Cl.
*G03F 1/00* (2006.01)

(52) U.S. Cl. .............................. 430/5; 430/311; 430/394

(58) Field of Classification Search ...................... 430/5, 430/311, 394

See application file for complete search history.

(56) References Cited

U.S. PATENT DOCUMENTS

| | | | |
|---|---|---|---|
| 6,548,424 B2 | 4/2003 | Putkonen |
| 6,689,220 B1 | 2/2004 | Nguyen |
| 6,767,582 B1 | 7/2004 | Elers |
| 6,989,229 B2 | 1/2006 | Lucas et al. |
| 2002/0042165 A1 | 4/2002 | Putkonen |
| 2002/0081844 A1 | 6/2002 | Jeon et al. |
| 2002/0106451 A1 | 8/2002 | Skarp et al. |
| 2003/0054260 A1 | 3/2003 | Dao et al. |
| 2003/0068565 A1 | 4/2003 | Ki et al. |
| 2003/0096468 A1 | 5/2003 | Soininen et al. |
| 2003/0113480 A1 | 6/2003 | Kil et al. |
| 2004/0014295 A1 | 1/2004 | Kim |
| 2004/0029379 A1 | 2/2004 | Yamasaki et al. |
| 2004/0094093 A1 | 5/2004 | Sneh |
| 2004/0137167 A1 | 7/2004 | Nguyen |
| 2004/0196447 A1 | 10/2004 | Watanabe |
| 2005/0052651 A1 | 3/2005 | Kim |
| 2005/0053851 A1 | 3/2005 | Berman et al. |

FOREIGN PATENT DOCUMENTS

EP     1242647 B1    8/2003

*Primary Examiner*—Mark F Huff
*Assistant Examiner*—Rashid Alam
(74) *Attorney, Agent, or Firm*—Wells St. John P.S.

(57) ABSTRACT

The invention includes methods for photo-processing photo-imageable material. Locations of the photo-imageable material where flare hot spots are expected to occur are ascertained. A substantially uniform dose of light intensity is provided to at least the majority of the photo-imageable material other than the hot spot locations, and is not provided to the hot spot locations. The provision of the substantially uniform dose of light intensity can occur during formation of a primary pattern in the photo-imageable material with a reticle, utilizing the same reticle as that used for making the primary pattern; or can occur at a separate processing stage than that utilized for forming the primary pattern and with a separate reticle from that utilized to form the primary pattern. The invention also includes reticle constructions which can be utilized for photo-processing of photo-imageable material.

7 Claims, 11 Drawing Sheets

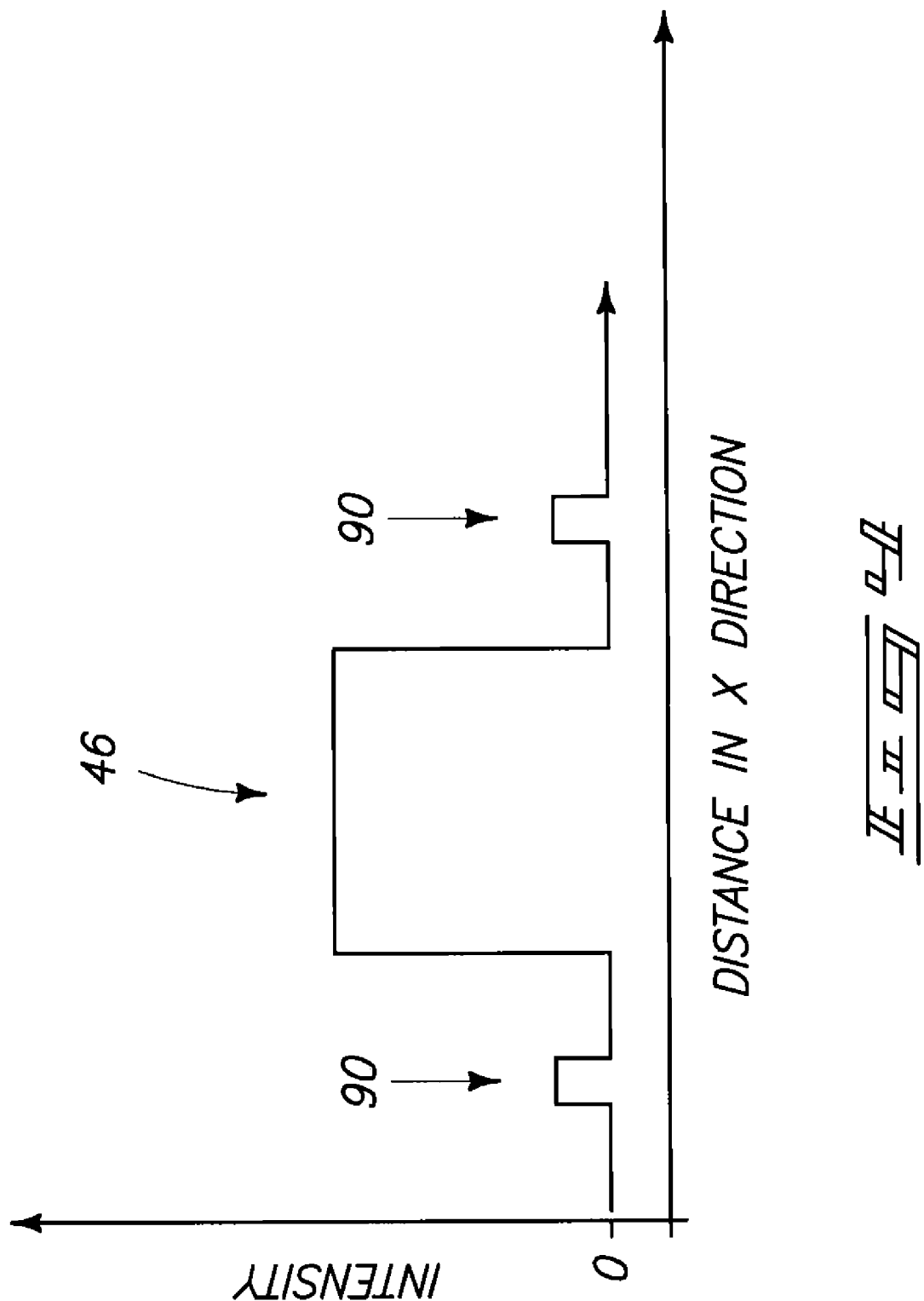

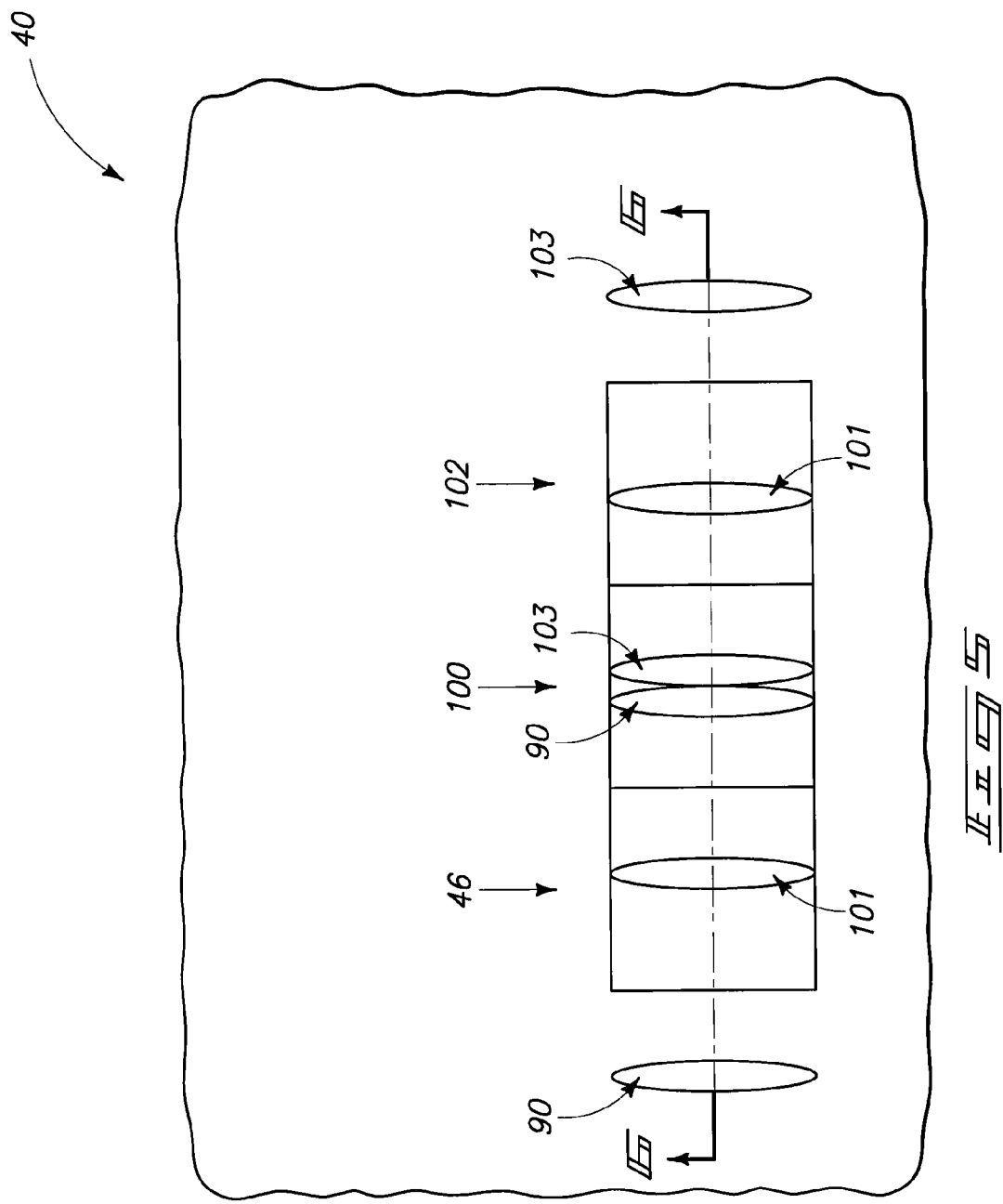

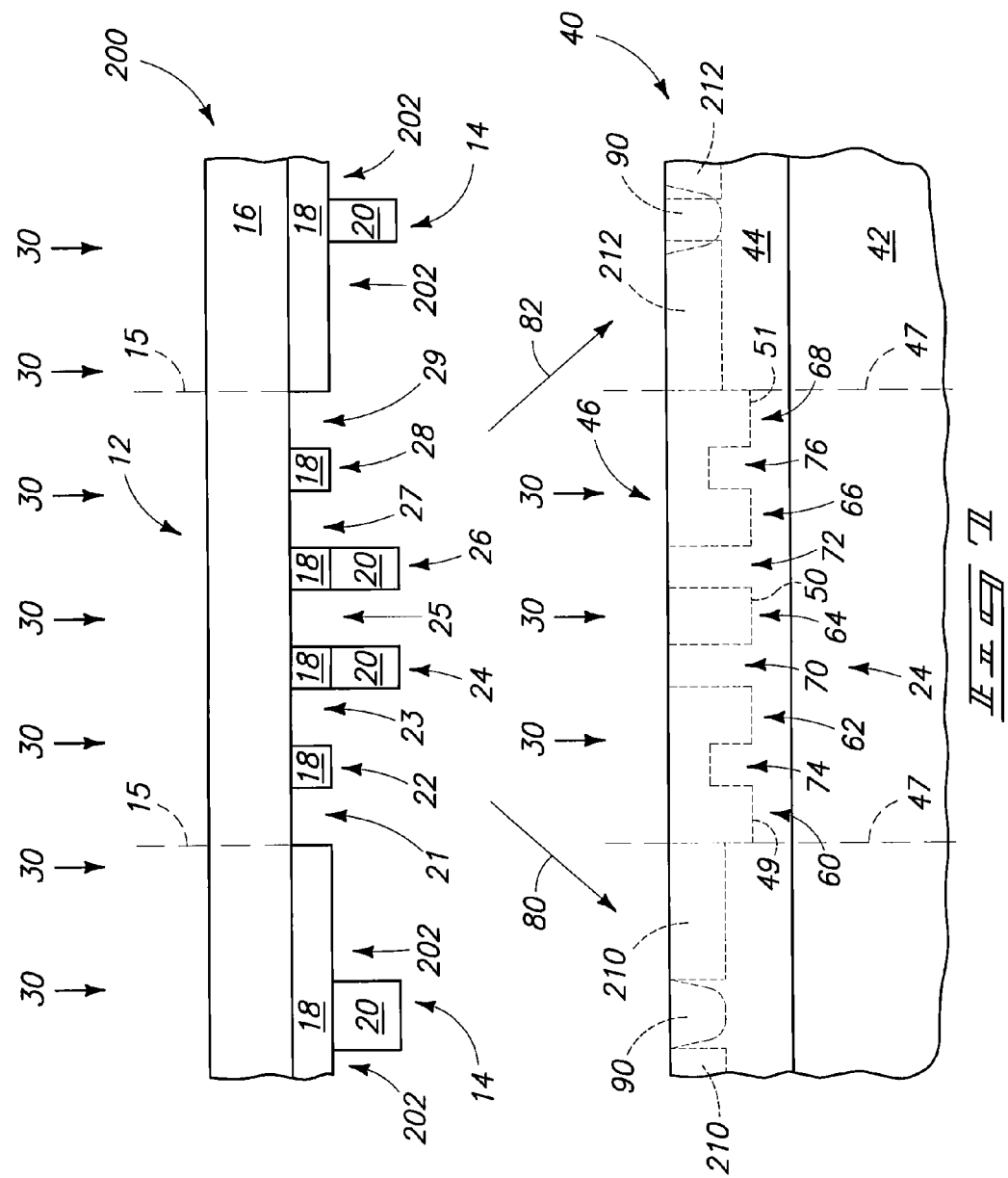

METHODS FOR PHOTO-PROCESSING PHOTO-IMAGEABLE MATERIAL

RELATED PATENT DATA

This patent resulted from a continuation of U.S. patent application Ser. No. 11/166,558, which was filed Jun. 24, 2005, issued as U.S. Pat. No. 7,767,363, and which is hereby incorporated herein by reference.

TECHNICAL FIELD

The invention pertains to reticle constructions, and to methods for photo-processing photo-imageable material.

BACKGROUND OF THE INVENTION

Photolithography is commonly used during formation of integrated circuits on semiconductor wafers. More specifically, a form of radiant energy is passed through a radiation-patterning tool and onto a radiation-sensitive material associated with a semiconductor wafer. The radiant energy can be referred to as actinic energy, and will typically be light in the ultraviolet (UV) range or visible range. The radiation-sensitive material is a photo-imageable material, such as, for example, photoresist.

The radiation-patterning tool can be referred to as a photomask or a reticle. The term "photomask" traditionally is understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized with their traditional meanings.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation patterning. Accordingly, it is desired to develop improved tools and processes for radiation patterning.

SUMMARY OF THE INVENTION

In one aspect, the invention encompasses a method of photo-processing photo-imageable material. A semiconductor substrate is provided, with the substrate having a photo-imageable material thereover. Locations of the photo-imageable material where flare hot spots are expected to occur are determined. Such locations are defined as hot spot locations, and the remainder of the photo-imageable material is defined as a non-flare location. A substantially uniform dose of light intensity is provided to at least the majority of the non-flare location and not to the hot spot locations. The light can comprise any suitable wavelength of electromagnetic radiation, but typically will be in the UV or visible range.

In one aspect, the invention includes a method of forming a pattern of light intensity across an expanse of photo-imageable material. A reticle is provided which is configured to generate a primary pattern of different intensities from light passing therethrough. The reticle is stepped to different locations over the photo-imageable material, and light is provided to the reticle at the different locations to form a series of primary patterns across the photo-imageable material. The light also forms flare regions of light intensity in locations of the photo-imageable material during the formation of the primary patterns. The locations of the flare regions in the photo-imageable material are defined as flare locations, and the remainder of the photo-imageable material is defined as a non-flare location. The flare locations have areas of maximum flare intensity. A substantially uniform dose of light intensity is provided to at least the majority of the non-flare location and not to the areas of maximum flare intensity of the flare locations.

In one aspect, the invention includes a method of utilizing a reticle to pattern an expanse of photo-imageable material. A reticle is provided. The reticle is configured to be stepped across the expanse of photo-imageable material to provide a series of repeating patterns of light intensity onto the photo-imageable material. The reticle is divided into a main-field region and a compensating region. The main-field region is configured to generate a primary pattern of different intensities from light passing therethrough, and has a first total area. The compensating region has a second total area which is at least about 25% of the first total area. The compensating region is configured to provide a substantially uniform intensity across the entirety of the second total area from the light passing therethrough. Light is passed through the reticle and then onto the photo-imageable material. The light passing through the main-field region forms the primary pattern on the photo-imageable material. The light passing through the main-field region also forms one or more flare regions on the photo-imageable material outside of the primary pattern. The light passing through the compensating region forms the substantially uniform intensity across the segment of the photo-imageable material extending substantially entirely from the primary pattern to at least one of the flare regions. The substantially uniform intensity is substantially equal to an intensity of at least one of the flare regions.

In one aspect, the invention includes a reticle configured to be stepped across an expanse of photo-imageable material to provide a series of repeating light-intensity patterns onto the photo-imageable material. The reticle includes a reticle substrate. A main-field region of the substrate is configured to generate a primary pattern of different intensities from light passing therethrough. The main-field region generates flare proximate the primary pattern when generating the primary pattern. The main-field region has a first total area. The reticle also includes a compensating region of the substrate proximate the main-field region. The compensating region has a second total area which is at least about 25% of the first total area. The compensating region is configured to generate substantially uniform intensity across the entirety of the second total area from light passing therethrough. The substantially uniform intensity is about the same as an intensity of the flare generated from the main-field region of the substrate.

BRIEF DESCRIPTION OF THE DRAWINGS

Preferred embodiments of the invention are described below with reference to the following accompanying drawings.

FIG. 3 is a diagrammatic top view of a semiconductor substrate illustrating a region exposed during photo-processing.

FIG. 5 is a diagrammatic view of a fragment of a photo-imageable material illustrating an exemplary pattern of intensity that can be formed during photo-processing as a reticle is stepped across the photo-imageable material.

FIG. 7 is a diagrammatic, cross-sectional view of an exemplary reticle of the present invention and a semiconductor substrate shown at a processing stage in which light patterned with the reticle is directed toward the semiconductor substrate.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the present invention is a recognition that flare regions formed during photolithographic processing can problematically interfere with formation of desired patterns in photo-imageable material. A further aspect of the invention includes strategies for addressing problems created by flare regions, and includes reticle substrates suitable for utilization in such strategies.

In some aspects, the invention includes recognition that the aerial image intensity of patterned radiation at any image point across a radiation-imageable material is the sum of a constant part and a modulating part. The modulating part carries the image information and the constant part provides the exposure power. It is desired for the sum to be uniform over an entire image to provide critical dimension (CD) control over the entire exposure area. Localized flare increases the constant part locally and makes the exposure non-uniform over the image area. This degrades the CD uniformity and the process control, thereby limiting yield. In exemplary aspects, this problem is addressed by improving the uniformity of the constant part and thereby the uniformity of the printed features.

Problems caused by flare regions are discussed with reference to FIGS. 1-6, and strategies which can be utilized for addressing such problems are discussed with reference to FIGS. 7-12.

Figure 1:
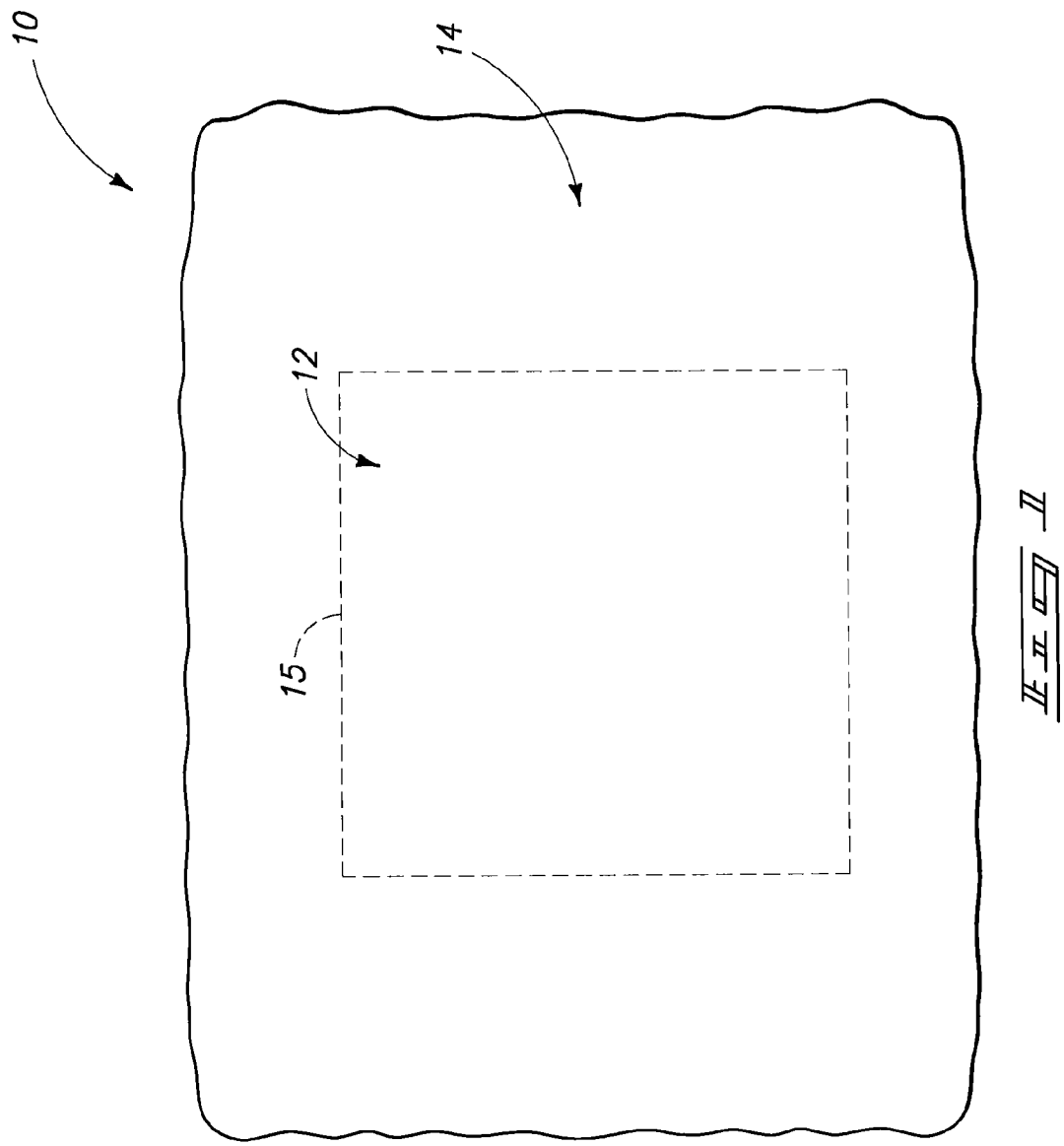
FIG. 1 is a diagrammatic top view of a fragment of a reticle.

An exemplary reticle construction 10 is illustrated in FIG. 1. The reticle construction includes a so-called main-field region 12, and a peripheral region 14 surrounding the main-field region. A dashed-line 15 is provided to diagrammatically illustrate a boundary between the peripheral region 14 and the main-field region 12.

The main-field region is configured to pattern actinic energy (in other words, light) passing therethrough. The patterned light can then be impacted on a photo-imageable material and utilized to form a desired pattern within the photo-imageable material. Photo-imageable material is commonly photoresist, which can be either a positive resist or a negative resist. The patterned photo-imageable material can subsequently be utilized as a mask over a semiconductor substrate during fabrication of devices associated with the semiconductor substrate.

The region 14 provides a handle for manipulating construction 10 during the fabrication of main-field region 12, as well as during the utilization of main-field region 12 in a photolithographic process.

Figure 2:
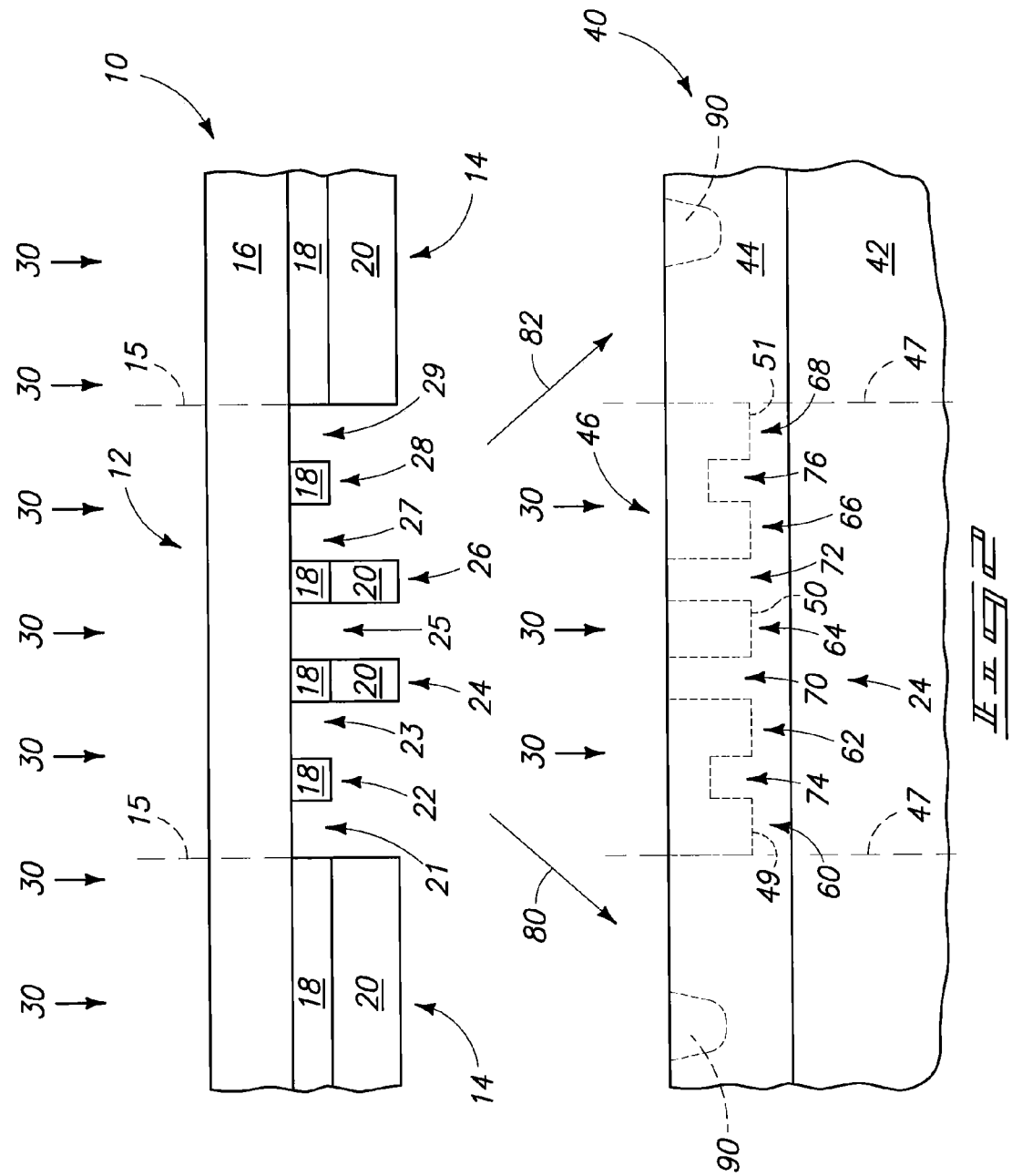
FIG. 2 is a diagrammatic, cross-sectional view of a fragment of a reticle and a fragment of a semiconductor substrate shown at a processing stage in which the reticle is utilized to pattern light directed toward the semiconductor substrate.

Referring next to FIG. 2, such illustrates a diagrammatic, cross-sectional view of the exemplary reticle construction 10 during a photolithographic process. The reticle construction comprises the main-field region 12 and peripheral region 14 discussed previously, with the main-field region being shown in more detail in FIG. 2 than in FIG. 1.

Reticle construction 10 is shown comprising a base 16, a first layer 18 directly against the base, and a second layer 20 directly against the first layer. The base 16 can be a relatively transparent material, such as, for example, quartz; the first layer 18 can be a material of intermediate transparency, such as, for example, molybdenum silicide; and the second layer 20 can be a relatively opaque material, such as, for example, a material comprising, consisting essentially of, or consisting of chromium.

The terms "relatively transparent" and "relatively opaque" are utilized to indicate that the materials 16 and 20 are transparent and opaque, respectively, relative to one another. Material 16 will typically be substantially entirely transparent, and accordingly will typically have a transmittance of about 100%. Material 20 will typically be substantially entirely opaque, and accordingly will typically have a transmittance of about 0%. Material 18 will have a transparency intermediate the transparency of base 16 and layer 20, and can have a transmittance of, for example, about 6%.

In particular aspects, the base 16 can be considered to have a base amount of transmission, the first layer 18 can be considered to have a first amount of transmission, and the second layer 20 can be considered to have second amount of transmission; with the base amount of transmission being greater than the first amount of transmission which is in turn greater than the second amount of transmission.

In the shown orientation, base 16 is over layer 18, which in turn is over layer 20. It is to be understood, however, that the reticle construction 10 can also be described in an inverse orientation relative to that shown, in which layer 18 is over base 16 and layer 20 is over layer 18.

The main-field region 12 is shown having a plurality of patterned features 22, 24, 26 and 28 provided therein, and having a series of gaps 21, 23, 25, 27 and 29 between the features. Some of the features contain the relatively opaque material 20 (features 24 and 26) while others only contain the intermediate transparency material 18 (features 22 and 28). Features 24 and 26 will substantially block light, while the features 22 and 28 will reduce an intensity of the light passing therethrough without entirely blocking the light. Features 22 and 28 can be used for changing more than just an intensity of the light. For example, features 22 and 28 can be used to impose a phase-shift on the light.

Exemplary light (i.e., actinic energy) 30 is shown directed toward reticle 10 from above the reticle, and is shown passing through the main-field of the reticle. The light is patterned by the main-field of the reticle. Specifically, the light passing from the main-field of the reticle has a primary pattern of intensity imposed by the reticle.

A semiconductor construction 40 is shown beneath the reticle to illustrate utilization of the patterned light formed with the reticle. The construction 40 comprises a substrate 42 having a photo-imageable material 44 thereover.

Substrate 42 can comprise a monocrystalline silicon wafer at a processing stage of integrated circuit fabrication, and accordingly having various materials associated therewith. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Photo-imageable material 44 can comprise, consist essentially of, or consist of photoresist.

Light patterned by the main-field 12 of the reticle forms a primary radiation intensity (i.e., light intensity) pattern 46 within photo-imageable material 44. The general location of the primary pattern is bounded by dashed-lines 47, and features of the primary pattern are illustrated by dashed-lines 49, 50 and 51.

The intensity of radiation within primary pattern 46 is diagrammatically illustrated by the depth of the radiation within material 44, with deeper regions indicating higher intensity and less deep regions indicating less intensity. The primary pattern has high-intensity regions 60, 62, 64, 66 and 68 corresponding to areas where radiation has passed through gaps 21, 23, 25, 27 and 29, respectively, of the main-field region 12 of the reticle. The primary pattern also has zero-intensity regions 70 and 72 where the radiation has been blocked by features 24 and 26, respectively, of the main-field region. Additionally, the primary pattern has intermediate intensity regions 74 and 76 where the radiation has been partially-blocked by features 22 and 28, respectively, of the main-field region.

Although most of the radiation (in other words, light) passing through the reticle is scattered along the way to the substrate with relatively small-angle so that the radiation remains directed primarily along the original path that the radiation had in entering the reticle, some of the radiation can be scattered at a higher angle. Radiation scattered at a relatively high angle is represented by the arrows 80 and 82 in FIG. 2. The high-angle scattered radiation can form so-called flare regions 90 outside of the primary pattern 46.

The flare regions can interfere with subsequent processing of photo-imageable material 44. It is common for the flare regions to comprise about the same intensity as one another, as shown. The intensity within each flare region can be uniform, or can vary. For instance, at least some of the flare regions can comprise a central hot spot and intensity gradients around the hot spot. Alternatively, each of the flare regions can comprise about a uniform intensity across its entirety. The illustrated flare regions have central hot spots and intensity gradients around the hot spots.

After the intensity pattern is formed within the photo-imageable material 44, the material 44 can be subjected to development with an appropriate solvent to selectively remove either exposed or non-exposed regions of the material. The development will thus transfer a pattern into the material corresponding to either the shown pattern of intensity or an inverse of the shown pattern of intensity. Prior to the development of the pattern within material 44, however, the reticle will be stepped multiple times across the semiconductor substrate.

FIG. 3 shows a top view of semiconductor construction 40 at a processing stage in which the reticle has formed a single step over the semiconductor substrate. FIG. 3 diagrammatically illustrates the primary pattern 46 flanked by flare regions 90. In the shown construction, the flare regions are on opposing lateral sides of the primary pattern. It is to be understood, however, that the flare regions can occur on more than two opposing sides of the primary pattern, on only one side of the primary pattern, or in numerous other configurations depending on, among other things, the configuration of the reticle utilized to form the primary pattern, the wavelength of light passing through the reticle, and the distance between the reticle and the underlying semiconductor substrate during photolithographic processing with the reticle. In any event, the locations of the flare regions can be predicted for a given semiconductor process. The predictions can be based on, for example, one or both of calculations based on the various parameters that would be utilized during photo-imaging, and actual experiments utilizing a reticle in a processing apparatus with a semiconductor substrate.

Figure 4:
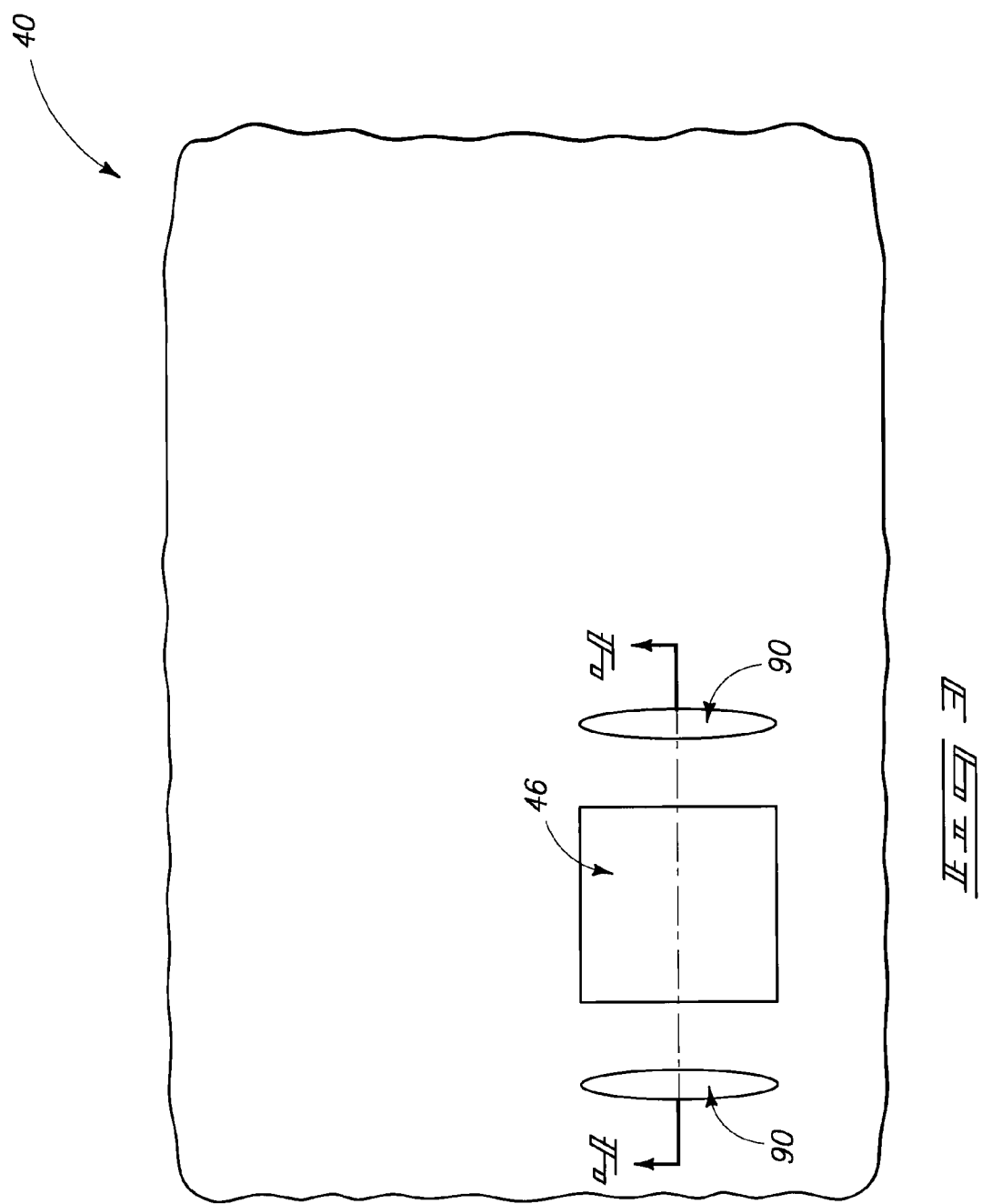
FIG. 4 is a graphical view of radiation intensity across the FIG. 3 exposed region. The graph of FIG. 4 is along the line 4-4 of FIG. 3.

A line 4-4 is shown passing through primary pattern 46 and flare locations 90. FIG. 4 diagrammatically illustrates a graph of intensity versus distance in the X direction along such line. The graph shows small intensity peaks corresponding to flare locations 90, and shows a large intensity peak corresponding to the location of primary pattern 46. It is noted that, as discussed above with reference to FIG. 2, the primary pattern would actually have a series of high intensity regions and low intensity regions formed therein. The primary pattern is, however, shown having a single uniform high intensity in the diagrammatic representations of FIGS. 3 and 4 to simplify the discussion that follows.

FIG. 5 shows a pattern that results as the reticle is stepped across substrate 40 to form a series of primary patterns. The series includes primary patterns 100 and 102 in addition to the pattern 46. The primary pattern 46 has the flare regions 90 associated therewith, the primary region 100 similarly has flare regions 101 associated therewith, and primary region 102 has flare regions 103 associated therewith. The diagram of FIG. 5 shows a construction in which the reticle has been stepped over three separate locations of a semiconductor substrate to form three repeats of the primary pattern. It is to be understood that the reticle would typically be stepped more than three times to substantially entirely cover the wafer with the repeating primary pattern.

Figure 6:
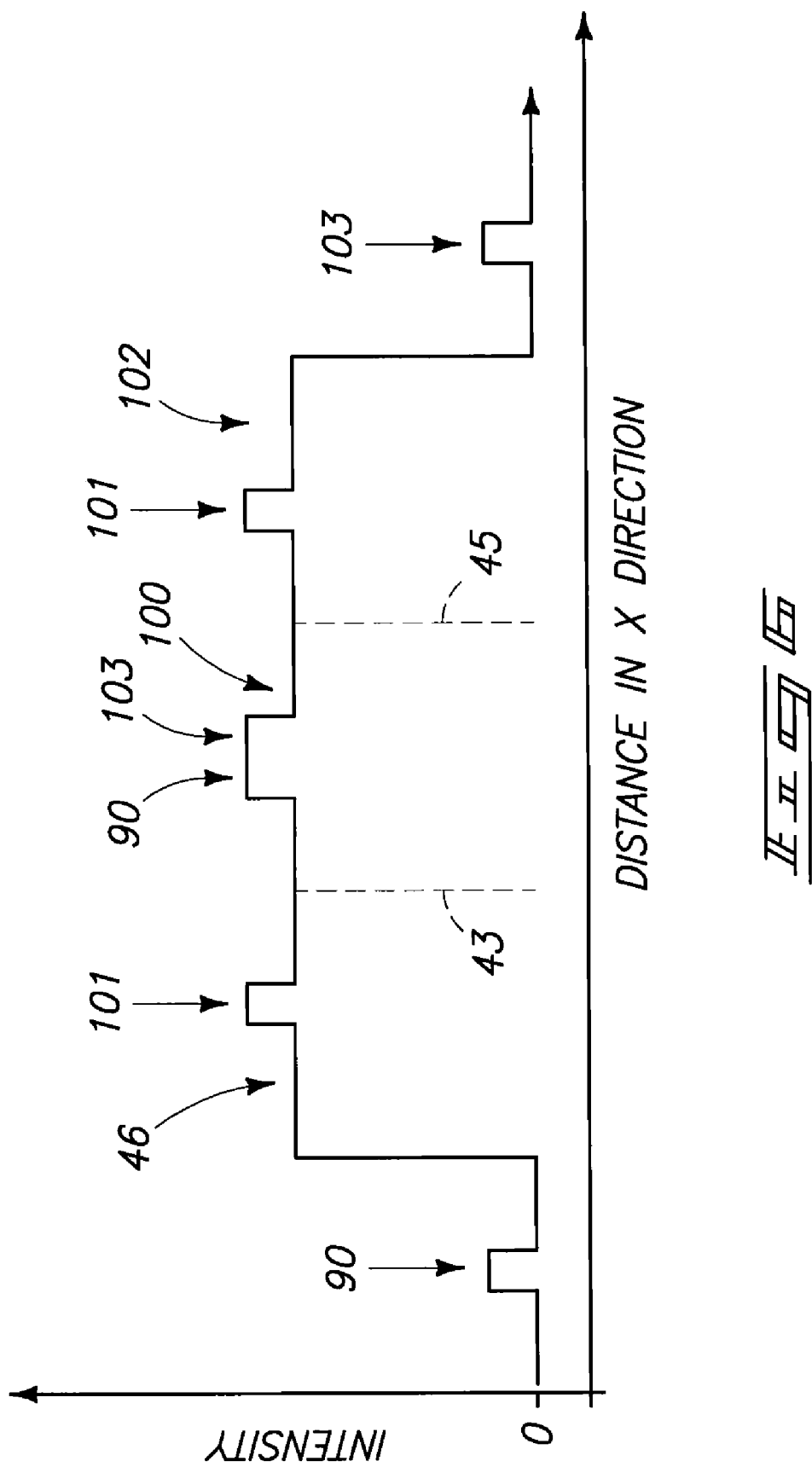
FIG. 6 is a graphical view of radiation intensity across the FIG. 5 exposed region. The graph of FIG. 6 is along the line 6-6 of FIG. 5.

A line 6-6 is shown extending across the patterned intensity regions of FIG. 5. FIG. 6 shows the variation of intensity along line 6-6, and shows flare regions 90, 101 and 103 creating variations on the primary patterns 46, 100 and 102. An interface between primary pattern 46 and primary pattern 90 is diagrammatically illustrated with dashed-line 43, and an interface between primary pattern 90 and primary pattern 102 is diagrammatically illustrated with a dashed-line 45.

The graph of FIG. 6 shows that flare regions can impose undulations of intensity on the intensities of the primary patterns. Such can detrimentally cause a pattern ultimately developed in a photo-imageable material to be different than that which would be developed if the flare region undulations had not been present. It is therefore desired to remove the flare region undulations. One strategy for removing the flare region undulations would be to eliminate flare, but such is typically not practical. Another strategy is to provide additive radiation to regions between the flare regions so that the flare region undulations are no longer discernible, or at least no longer problematic.

Figure 8B:
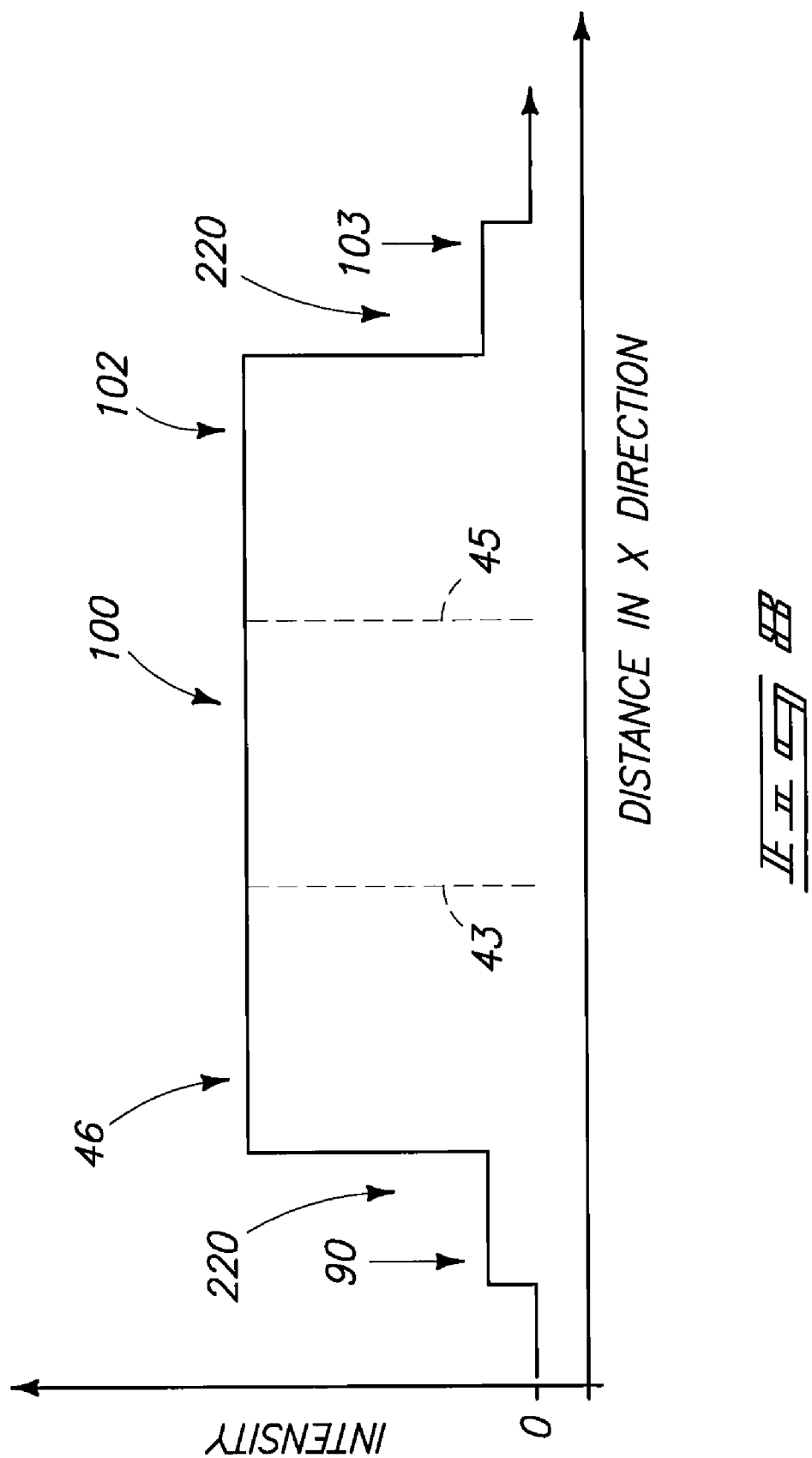
FIG. 8 is a graphical representation of radiation intensity that can be obtained with the FIG. 7 reticle, with the FIG. 8 graph corresponding to a processing stage comparable to that described with the FIG. 6 graph.

FIGS. 7 and 8 illustrate an exemplary process by which additive radiation can be provided to regions between flare regions. In referring to FIGS. 7 and 8, similar numbering will be used as was utilized above in describing FIGS. 1-6, where appropriate. FIG. 7 illustrates a preliminary stage in a photo-lithographic process in which light 30 is passed through a reticle 200 to pattern the light, and in which the patterned light is impacted on a photo-imageable material 44. The photo-imageable material is supported by a semiconductor substrate 42, and is part of a semiconductor construction 40.

Reticle 200 comprises the base 16, first layer 18, and second layer 20 discussed above with reference to reticle 10 of FIG. 2. Reticle 200 also comprises the main-field 12 and peripheral region 14 discussed above. The reticle 200 differs from the reticle 10 of FIG. 2 in that reticle 200 comprises segments 202 of the peripheral region from which opaque material 20 has been removed. Light can pass through segments 202 of the peripheral region 14, and the segments are configured to be in appropriate locations such that light passing therethrough will extend between the flare locations and the primary pattern 46 formed in the photo-imageable material 44.

In some aspects of the invention, all portions of photo-imageable material 44 that are not within flare regions can be referred to as non-flare locations, and the locations of the flare regions can be referred to as flare locations. As discussed above, the flares can have individual hot spots associated therewith so that the intensity of the flares varies within the individual flare regions, or can have a relatively constant intensity throughout such that the entire flare region can be considered a uniform hot spot. The locations of flare hot spots can be considered hot spot locations. If a flare has a peak intensity at the center, the flare can be considered to have a hot spot location centrally located within a flare location. For instance, the flare locations 90 of FIG. 7 are shown having peak intensity in the center and less intensity at the edges. Accordingly, the central regions of the flare locations can be considered to be hot spot locations centrally located within the flare locations.

Light passing through segment 202 forms segments 210 and 212 of radiation intensity within photo-imageable material 44. Such segments of intensity extend from flare locations 90 to primary patterned region 46. The segment 210 is shown extending only to an edge of the flare location 90 at the left-most side of the FIG. 7 cross-section of construction 40, whereas the segment 212 is shown extending across some of the right-most flare location 90 and extending to about a hot spot of the flare location 90. Segments 210 and 212 thus illustrate two slightly different approaches for providing radiation intensity within a photo-imageable material. Either or both of the approaches can be utilized in exemplary applications.

The intensity of segments 210 and 212 is substantially uniform, and accordingly corresponds to a substantially uniform dose of light intensity provided to non-flare locations of photo-imageable material 44. It can be preferred that such dose of light intensity be about the same as the intensity of the majority of the flare locations, or at least about the same as the intensity of the hot spots of the flare locations. In some aspects, the substantially uniform dose of light intensity can be about the same as an expected maximum intensity of the flare regions, or about the same as an expected average intensity of the flare regions.

The intensity of segments 210 and 212 can be considered to be about the same as the intensity of the flare regions if the intensity of the segments effectively cancels the undulations in intensity that would otherwise be caused by the flare regions. In other words, if the problems discussed above with reference to FIG. 6 are avoided. In particular aspects, the segments 210 and 212 can have an intensity that is within about 5% of the maximum intensity of the hot spots of the flare regions 90.

The portions 202 of the reticle peripheral region 14 can be considered to compensate for problems induced by the flare regions, and accordingly can be referred to as segments of a compensating region in some aspects of the invention. Preferably the compensating region will be utilized to provide a substantially uniform dose of radiation to at least the majority of the non-flare location of a photo-imageable material, and in some aspects the compensating region will be utilized to provide a substantially uniform dose of radiation to the entirety of the non-flare location of a photo-imageable material.

FIG. 8 shows a graph of intensity similar to the graph of FIG. 6, but the graph if FIG. 8 shows utilization of the reticle of FIG. 7 instead of the reticle of FIG. 2. Specifically, the compensating region 202 has cancelled most of the undulations previously caused by the flare regions. FIG. 8 is illustrated with the same numbering as that utilized in FIG. 6, and accordingly shows regions 46, 100 and 102 corresponding to three steps of the reticle. However, in the aspect of FIG. 8 such three steps would be conducted with the reticle 200, whereas in the aspect of FIG. 6 such three steps were conducted with the reticle 10 of FIG. 2.

It is noted that FIG. 8 shows that the reticle can treat all non-flare regions of an image pattern, but that the edges of the pattern will not be overlapped by a main-field. Accordingly, low-intensity corners 220 are illustrated occurring at peripheral edges of segments 46 and 102.

FIGS. 7 and 8 show an aspect in which a compensating region of a reticle extends over flare regions generated by the reticle. In some aspects, the compensating region of the reticle may not reach to the flare regions generated by the main-field of the reticle. In such aspects, the reticle can be configured so that the main-field creates an image for a particular step of the reticle simultaneously with the compensating region providing a uniform dose of intensity around flare regions formed during a neighboring step of the reticle. Thus, adjacent steps of the reticle can form partially overlapping patterns in a photo-imageable material, with the overlap being utilized to provide additive intensity to compensate for flares.

Figure 9:
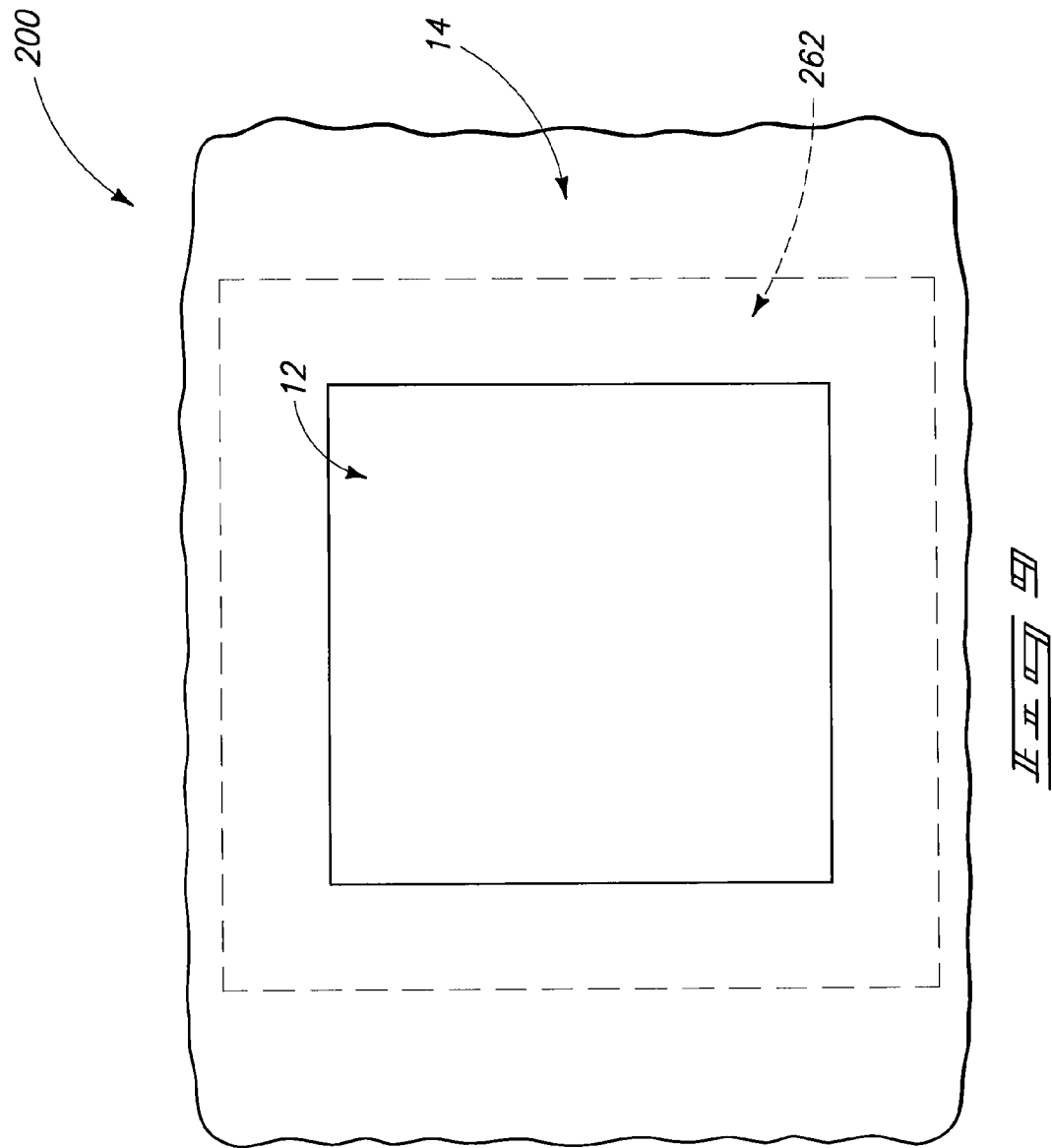
FIG. 9 is a diagrammatic, top view of a fragment of a reticle illustrating an exemplary relationship of a compensating region to a primary region in accordance with one aspect of the present invention.

The reticle 200 of FIG. 7 can have a general shape similar to that of the FIG. 1 reticle. FIG. 9 shows top view of the reticle 200, and shows that the reticle comprises the main-field 12 and peripheral region 14 described previously, with the boundary 15 being provided to illustrate an interface between the main-field and peripheral regions. FIG. 9 also shows a compensating region 262 within a portion of the peripheral region, and extending entirely around the main-field region. Although the shown compensating region is within only a portion of the peripheral region, the invention also includes aspects in which the entirety of the peripheral region is a compensating region. Also, although the shown compensating region extends entirely around the main-field region, the invention also includes aspects in which the compensating region is along only a portion of the periphery of the main-field region.

In particular applications of the present invention, the main-field region can be considered to have first total area, which is the overall area of the main-field region. The compensating region can be either some or all of the peripheral region 14, and can have a total area which is at least 25% of the first total area of the main-field region, at least 50% of the first total area, or even at least 75% of the first total area. The reticle of FIG. 9 has a main-field bounded by a substantially rectangular periphery, and accordingly the main-field has four primary sides. The rectangular periphery can be considered to comprise a total distance, and the compensating region can extend along at least 25% of such distance, along at least 50% of such distance, or even along at least 100% of such distance. Accordingly, the compensating region can extend along at least half of the primary sides of the main-field region, or in some aspects along all of the primary sides of the main-field region.

The amount of compensating region can vary depending upon the location of the flares. For instance, if the flares only occur on opposing lateral sides of the primary pattern formed with the reticle, then the compensating region can be formed only on the opposing sides of the main-field of the reticle. On the other hand, if the flares occur around all of the sides of a primary pattern formed with the reticle, then it can be desired to form the compensating region to be around all of the primary sides of the main-field of the reticle.

Figure 10:
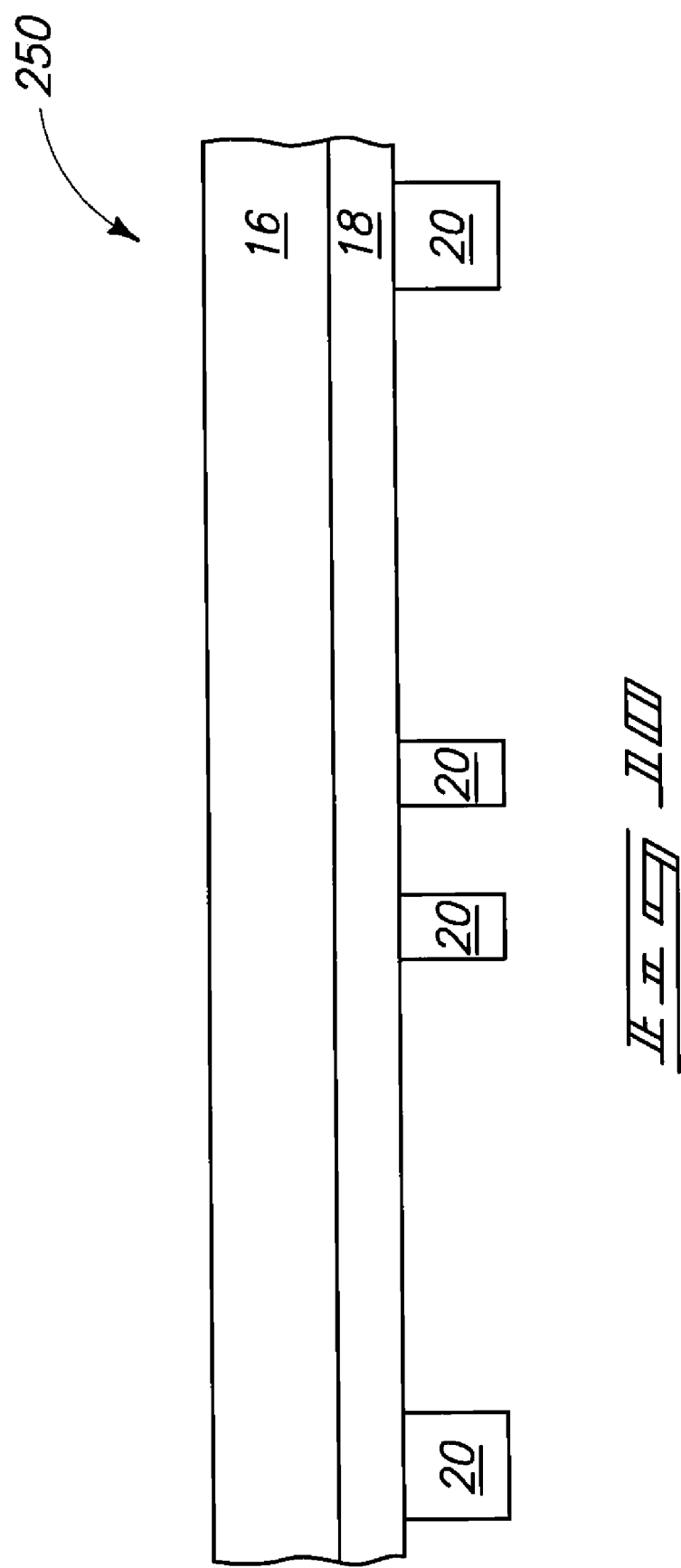
FIG. 10 is a diagrammatic, cross-sectional view of an embodiment of a reticle which can be utilized for photo-processing in accordance with exemplary aspects of the present invention.

The application of FIG. 7 incorporates the compensating region into the same reticle as the main-field region. Accordingly, the substantially uniform dose of light intensity is formed with the compensating region at the same time that the primary pattern is formed with the main-field region. It is to be understood, however, that at least some of the additional dose of radiation provided to non-flare locations can be provided with a second reticle or photomask that does not contain a main-field region. FIG. 10 illustrates a fragment of a radiation-patterning tool 250 (such tool can be either a reticle or photomask) configured solely to provide compensating regions to non-flare locations of a photo-imageable material.

The construction 250 comprises the base 16, first layer 18, and second layer 20 described previously. The first layer 20 (i.e., the relatively opaque material) is patterned solely to overlap flare locations of a photo-imageable material, and the remainder of the construction 250 is formed to provide a substantially uniform dose of light intensity to the non-flare locations of the photo-imageable material.

The tool 250 can be utilized in combination with a tool of the type described in FIG. 7. Accordingly, one of the tools will have both a main-field region and a compensating region, and the other tool will have only the compensating region. Alternatively, the reticle having the compensating region without a main-field region can be utilized in combination with a reticle which has only a main-field region (i.e., a tool without any compensating region).

In two-reticle processes in which one of the reticles has a main-field region and the other has only a compensating region, the reticles can be utilized in any order relative to one another. Accordingly, the substantially uniform dose provided to compensate for flare hot spots can be provided before or after the occurrence of the flare hot spots. If the tool of FIG. 10 is a reticle, such reticle can be stepped in a similar pattern as the reticle having the main-field region, or can be stepped in a different pattern. If the tool of FIG. 10 is a photomask, then the tool will cover an entire expanse of a photo-imageable material at once, and will not be stepped.

In some aspects, a tool with only the compensating region can be utilized to fix a periphery around a patterned portion of a photo-imageable material. For instance, as discussed above, a reticle can be configured so that adjacent steps of the reticle form partially overlapping patterns in a photo-imageable material, with the overlap being utilized to provide additive intensity to compensate for flares. The images formed in the photo-imageable material from peripheral steps of such reticle may not be treated to the same extent as the images formed from non-peripheral steps. In such instances, a tool with only the compensating region can be utilized to fix the periphery around a patterned portion of the photo-imageable material.

The configuration of the compensating region shown and discussed with reference to FIGS. 7-10 is but one exemplary configuration of a compensating region. It is to be understood that compensating regions can be formed with any configuration that directs a substantially uniform dose of radiation toward a substrate, preferably without inducing problematic flare locations.

Figure 12:
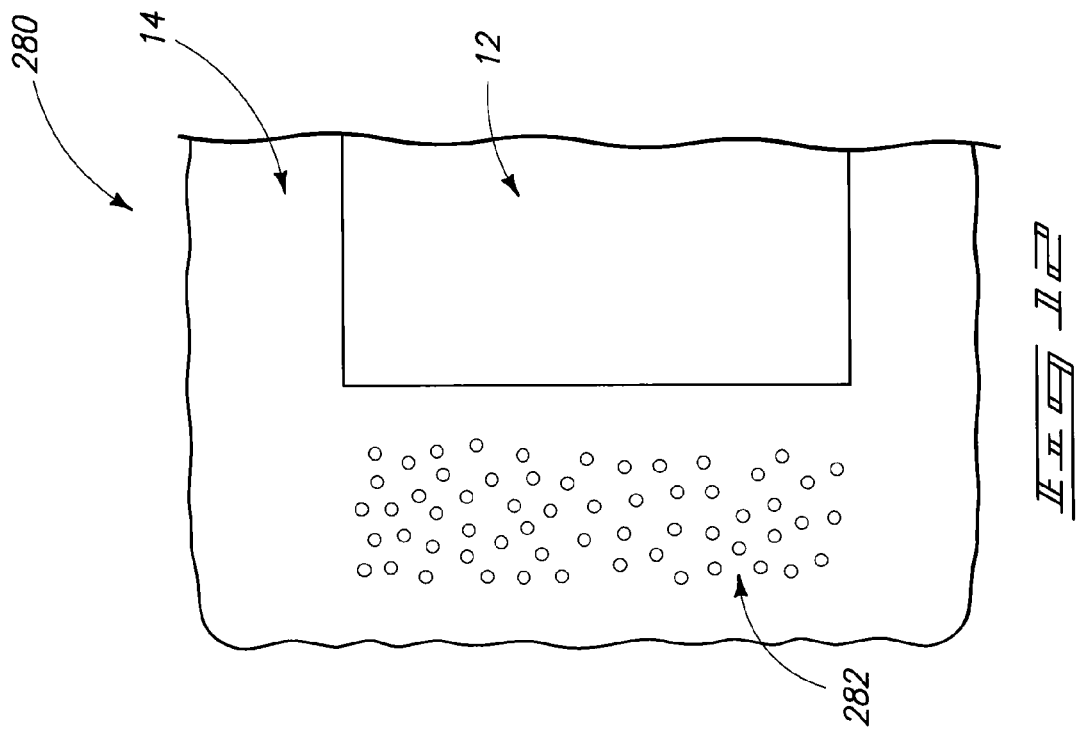
FIG. 12 is a diagrammatic top view of a reticle fragment illustrating an exemplary pattern that can be utilized in a compensating region in accordance with another aspect of the present invention.
Figure 11:
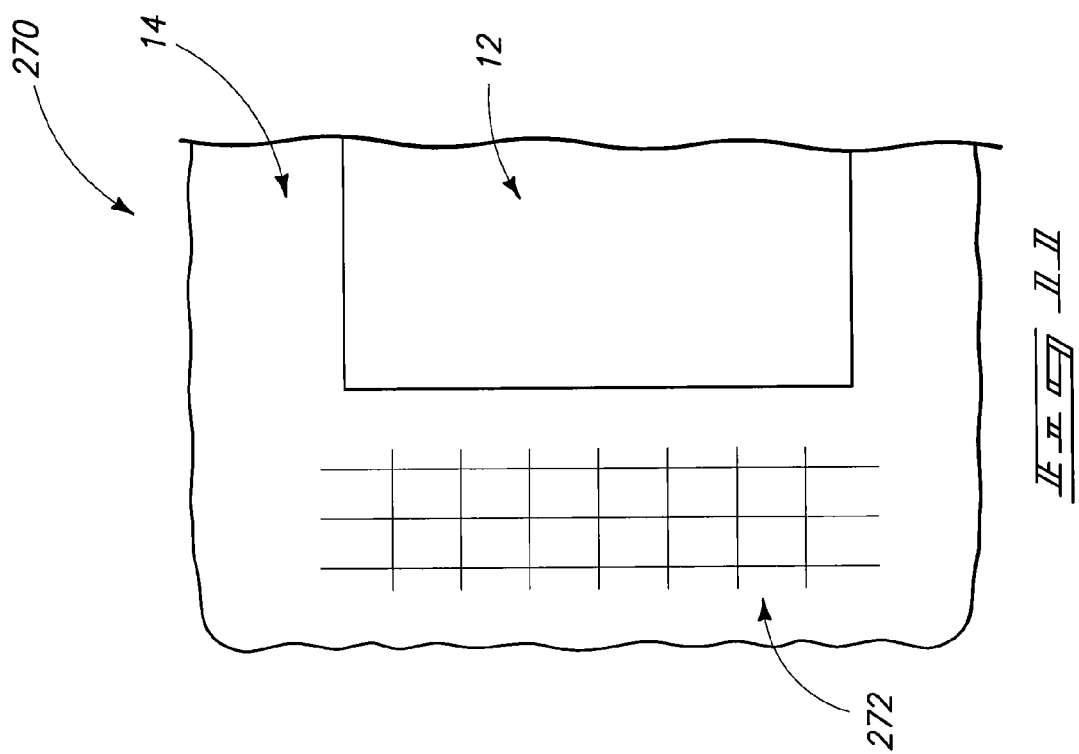
FIG. 11 is a diagrammatic top view of a reticle fragment illustrating an exemplary pattern that can be utilized in a compensating region in accordance with one aspect of the present invention.

FIGS. 11 and 12 illustrate a couple of additional configurations (270 and 280, respectively) that can be incorporated into compensating regions. Each of the constructions is shown to comprise a main-field region 12, a peripheral region 14 around the main-field region, and a compensating region within the peripheral region. The construction of FIG. 11 has a compensating region comprising a grating 272 formed to extend through one or more relatively opaque materials of the reticle. Radiation (i.e., light) can pass through the grating to provide a substantially uniform dose of radiation intensity to a photo-imageable material during photo-processing. The construction of FIG. 12 has a compensating region 282 comprising a plurality of small orifices or holes extending through one or more relatively opaque materials of the reticle. The orifices allow some radiation to pass therethrough and form a substantially uniform dose of radiation intensity that can be applied to non-flare regions of a photo-imageable material.

The grating 272 of FIG. 11 and the plurality of holes 282 of FIG. 12 can each be considered to be exemplary of a compensating region comprising a plurality of closely-spaced features formed within a substantially opaque material. The substantially opaque material can be, for example, the material 20 and/or material 18 of the exemplary reticles 10 and 200 of FIG. 2 and FIG. 7.

Flare can result from numerous causes, including, for example, defects in a lens, lens coating, lens design or lens housing. The flare can cause over-exposure in unintended locations of a photo-imageable material. The methodology of the present invention provides additional exposure to regions outside of hot spots, which can cause a more uniform background dose across an entire patterned field of a photo-imageable material than would result without such treatment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method for photo-processing photoresist, comprising:
   providing a silicon-containing substrate having photoresist thereover;
   determining locations of the photoresist where flare hot spots are expected to occur, such locations being defined as hot spot locations and the remainder of the photoresist being defined as a non-flare location;
   exposing the photoresist to a pattern of first actinic energy to form a primary pattern within the photoresist, and to form flare hot spots in the hot spot locations;
   exposing the photoresist to a compensating dose of second actinic energy that is provided in addition to the first actinic energy; the compensating dose being directed into at least the majority of the non-flare location and not directed into the hot spot locations;
   wherein the exposing of the photoresist to the pattern of first actinic energy comprises passing the first actinic energy through a first radiation-patterning tool to form the primary pattern and flare hot spots; and
   wherein the exposing of the photoresist to the compensating dose of second actinic energy comprises passing the second actinic energy through a second radiation-patterning tool; with said second radiation-patterning tool being a different radiation-patterning tool than the first radiation-patterning tool.

2. The method of claim 1 wherein the photoresist is exposed to the compensating dose of the second actinic energy prior to the exposure of the photoresist to the first actinic energy.

3. The method of claim 1 wherein the photoresist is exposed to the first actinic energy prior to the exposure of the photoresist to the compensating dose of the second actinic energy.

4. A method of forming a pattern of light intensity across an expanse of photoresist, comprising:
   providing a reticle configured to generate a primary pattern of different intensities from light passing therethrough; the reticle comprising a quartz base, and comprising patterned chromium-containing material along said base; the patterned chromium-containing material defining at least part of the primary pattern;
   stepping the reticle to different locations over the photoresist and providing light through the reticle at the different locations to form a series of the primary patterns across the photoresist, the light also forming flare regions of light intensity in locations of the photoresist during the formation of the primary patterns; the locations in the photoresist of the flare regions being defined as flare locations, and the remainder of the photoresist being defined as a non-flare location; the flare locations having areas of maximum flare intensity;
   in addition to forming the primary patterns across the photoresist, providing a substantially uniform dose of light intensity to an entirety of the non-flare location and not to the areas of maximum flare intensity of the flare locations; and
   wherein the reticle is a first reticle, and the substantially uniform dose is provided by light passing through a second reticle; with said second reticle being a different reticle than said first reticle.

5. The method of claim 4 wherein the intensity of the substantially uniform dose is about the same as the intensity at the areas of maximum flare intensity of the flare locations.

6. A method of utilizing a reticle to pattern an expanse of photo-imageable material, comprising:
   providing a reticle; the reticle being configured to be stepped across the expanse of photo-imageable material to provide a series of repeating patterns of light intensity onto the photo-imageable material; the reticle being divided into a main-field region and a compensating region; the main-field region being configured to generate a primary pattern of different intensities from light passing therethrough, and having a first total area; the compensating region having a second total area which is at least about 25% of the first total area; the compensating region being configured to provide a substantially uniform intensity across the entirety of the second total area from the light passing therethrough; and
   passing light through the reticle and then onto the photo-imageable material; the light passing through the main-field region forming the primary pattern on the photo-imageable material, and forming one or more flare regions on the photo-imageable material outside of the primary pattern; the primary pattern being the non-flare region; the light passing through the compensating region being a dose of light in addition to the light utilized to form the primary pattern, and forming said uniform intensity across a segment of the photo-imageable material extending substantially entirely from the primary pattern to at least one of the flare regions; said substantially uniform intensity being substantially equal to an intensity of the at least one of the flare regions.

7. The method of claim 6 wherein the substantially uniform intensity is substantially equal to a maximum intensity of the at least one of the flare regions.

* * * * *